(12) United States Patent
Marr et al.

(10) Patent No.: US 10,073,161 B2
(45) Date of Patent: Sep. 11, 2018

(54) METHODS AND APPARATUS FOR TRACKING PULSE TRAINS

(71) Applicant: RAYTHEON COMPANY, Waltham, MA (US)

(72) Inventors: Harry Marr, Manhattan Beach, CA (US); Jeffrey Caldwell, Hermosa Beach, CA (US); Ian S. Robinson, Redondo Beach, CA (US)

(73) Assignee: RAYTHEON COMPANY, Waltham, MA (US)

( * ) Notice: Subject to any disclaimer, the term of this patent is extended or adjusted under 35 U.S.C. 154(b) by 416 days.

(21) Appl. No.: 14/818,658

(22) Filed: Aug. 5, 2015

(65) Prior Publication Data

US 2017/0038465 A1    Feb. 9, 2017

(51) Int. Cl.
| | | |
|---|---|---|
| *G01R 23/00* | (2006.01) | |
| *G01S 7/292* | (2006.01) | |
| *G01S 3/02* | (2006.01) | |
| *G01S 7/02* | (2006.01) | |
| *G01S 7/28* | (2006.01) | |
| *G01R 23/15* | (2006.01) | |

(52) U.S. Cl.
CPC ............ *G01S 3/02* (2013.01); *G01S 7/021* (2013.01); *G01S 7/292* (2013.01); *G01R 23/15* (2013.01); *G01S 7/28* (2013.01)

(58) Field of Classification Search
CPC ...... G01R 23/00; G01R 23/15; G01R 23/155; G01S 7/021; G01S 7/2806; G01S 7/292; G01S 7/2923
See application file for complete search history.

(56) References Cited

U.S. PATENT DOCUMENTS

| | | | | |
|---|---|---|---|---|
| 4,146,892 A | | 3/1979 | Overman et al. | |
| 4,209,835 A | * | 6/1980 | Guadagnolo | G01R 29/033 |
| | | | | 342/13 |
| 5,534,866 A | * | 7/1996 | Rose | G01S 7/021 |
| | | | | 342/13 |
| 5,583,505 A | * | 12/1996 | Andersen | G01S 7/021 |
| | | | | 342/13 |
| 6,985,102 B1 | * | 1/2006 | Horn | G01S 7/021 |
| | | | | 342/13 |
| 7,133,887 B2 | * | 11/2006 | Sirois | G01S 7/021 |
| | | | | 708/422 |
| 7,397,415 B1 | * | 7/2008 | Wang | G01S 7/021 |
| | | | | 342/13 |
| 7,570,193 B2 | * | 8/2009 | Bagge | G01S 7/021 |
| | | | | 342/13 |

(Continued)

OTHER PUBLICATIONS

Jiang, Haiqing, Meiguo Geo and Yunjie Li. "Design and Implementation of the Pulse Tracker Based on FPGA", *Signal Processing*, 2006 8th International Conference on, vol. 4, IEEE, 2006.

(Continued)

*Primary Examiner* — Peter M Bythrow
(74) *Attorney, Agent, or Firm* — Daly, Crowley, Mofford & Durkee, LLP

(57) ABSTRACT

Method and apparatus for tracking pulse trains from one or more emitters. For a valid pulse, PRI parameters are measured. A pulse pattern count is incremented and checked to determine if a track is acquired for the emitter.

20 Claims, 8 Drawing Sheets

(56) References Cited

U.S. PATENT DOCUMENTS

| | | | | |
|---|---|---|---|---|
| 7,760,135 B2* | 7/2010 | Driggs | ............... | G01S 7/021 |
| | | | | 342/159 |
| 7,830,297 B1* | 11/2010 | Wang | ............... | G01S 7/021 |
| | | | | 342/13 |
| 8,184,040 B2* | 5/2012 | Takase | ............... | G01S 7/2926 |
| | | | | 342/11 |

OTHER PUBLICATIONS

Granger, Ede, et al. "A what-and-where fusion neural network for recognition and tracking of multiple radar emitters", *Neural Networks* 14.3 (2001): 325-344.

Zhi-hong, Lu, Zhao Yu and Xu Zheng. "Research on PRI Tracker System Design of Multi-Mode Radar Signal", *Intelligent Systems and Applications (ISA)*, 2011 $3^{rd}$ International Workshop on. IEEE, 2011.

Haykin, Simon. "Cognitive radar: a way of the future." *Signal Processing Magazine, IEEE* 23.1 (2006): 30-40.

\* cited by examiner

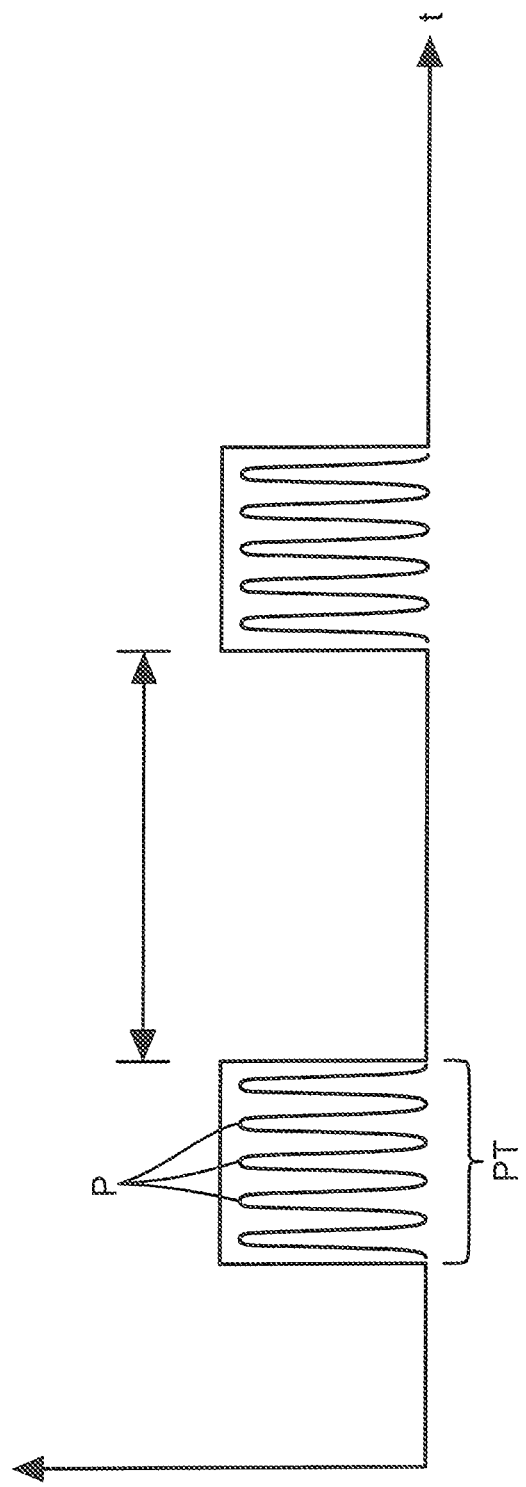

METHODS AND APPARATUS FOR TRACKING PULSE TRAINS

BACKGROUND

As is known in the art, it may be desirable to be able to track a source of emitted pulse patterns, such as from radar. As is also known, radar pulse patterns are becoming increasingly complex and difficult to ascertain. Conventional systems collect and store received pulse data for processing to detect pulse patterns on Von Neumann processors, for example. These operations require multiple writes to multiple memories that require in the order of many milliseconds to detect complex pulse patterns These systems do not operate in real time and are limited in scalability.

SUMMARY

Embodiments of the present invention provide methods and apparatus for processing received pulse data to identify pulse patterns and establish a track on the source of the received pulses. Embodiments utilize a feed forward/data flow process to identify pulse patterns for tracking a radar source in real time. Embodiments provide one or more of tracking pulse repetition intervals of arbitrary complexity in real time, processing to achieve real-time, time difference of arrival detection, and/or incorporating jitter and variance in the time difference of arrival measurement. In embodiments, a series of pulse filters identify a track with particular parameters.

It is understood that pulse repetition interval (PRI) can form the basis to identify various emitters. In general, emitters can be identified by the pulses they emit. A particular emitter may be known to emit pulses in a particular pattern. When the pattern is identified, the emitter can be identified and tracked.

The pulse repetition frequency (PRF) refers to the number of pulses per second of a repeating signal. The reciprocal of the PRF is the pulse repetition interval (PRI), which refers to the elapsed time from the beginning of one pulse to the beginning of the next pulse. In radar systems, a signal having a given frequency is turned on and off. Frequency refers to the carrier signal and the PRI refers to the number of switches. The pulse width refers to the amount of time the transmitter is turned on during each pulse.

After a transmitter emits a signal, the transmitter is turned off so the receiver can receive signal reflections from targets. Since the radio signal travels to and from the target, the PRI corresponds to a range of the radar. Longer range requires lower PRFs while higher PRFs shorten range, but broadcast more pulses for easier target detection. In general, low PRFs are used for radar search functions and high PRFs are used for radar track functions.

Embodiments of the invention are well suited to relatively high PRF tracker environments, in illustrative embodiments, a track is acquired by analyzing pulse trains without time consuming writes to memory.

In one aspect of the invention, a method comprises: (a) receiving a first pulse train from an emitter; (h) measuring pulse repetition interval parameters of the first pulse train; (c) receiving a further pulse train; (d) measuring pulse repetition interval parameters of the further pulse train; (e) incrementing a pattern count or a check pattern count based upon whether the further pulse train has a timing jitter error less than a jitter threshold, wherein the jitter error corresponds to a difference between the pulse repetition interval parameters of the further pulse train and pulse repetition interval parameters of a prior pulse train; (f) comparing the check pattern count to a track threshold; (g) determining whether a track for the emitter has been acquired based upon the check pattern comparison; and (h) repeating steps (c) to (f).

The method can further including one or more of the following features: the parameters include pulse width, amplitude, and frequency, the track threshold is determined using the pattern count, determining an anticipated time of arrival for the further pulse train, determining the anticipated time of arrival for the further pulse train from a current anticipated time of arrival and a next pulse repetition interval, dropping the emitter track if the detected pattern is no longer detected for a selected amount of time, and/or acquiring the emitter track without writes to memory.

In another aspect of the invention, a system comprises: a tracker module configured to: (a) receive a first pulse train from an emitter; (b) measure pulse repetition interval parameters of the first pulse train; (c) receive a further pulse train; (d) measure pulse repetition interval parameters of the further pulse train; (e) increment a pattern count or a check pattern count based upon whether the further pulse train has a jitter error less than a jitter threshold, wherein the jitter error corresponds to a difference between the pulse repetition interval parameters of the further pulse train and pulse repetition interval parameters of a prior pulse train; (f) compare the check pattern count to a track threshold; (g) determine whether a track for the emitter has been acquired based upon the check pattern comparison; and (h) repeat (c) to (g).

The system can further including one or more of the following features: the parameters include pulse width, amplitude, and frequency, the track threshold is determined using the pattern count, determining an anticipated time of arrival for the further pulse train, determining the anticipated time of arrival for the further pulse train from a current anticipated time of arrival and a next pulse repetition interval, dropping the emitter track if the detected pattern is no longer detected for a selected amount of time, and/or acquiring the emitter track without writes to memory, in a further aspect of the invention, a method comprises: (a) receiving a first PRI value for a pulse train received by an antenna; (b) measuring the first PRI value as variable PRI measured, initializing a variable pattern, and initializing a variable true cheek; (c) storing the first PRI value in a first slot of a PRI table; (d) incrementing the variable pattern and incrementing the variable checks; (e) measuring a next PRI value that becomes a new value for the variable PRI measured; (f) incrementing the value of variable checks if the value stored in the PRI table minus the value for PRI measured is less than or equal to a jitter error; (g) incrementing the variable pattern if the value of PRI table minus PRI measured is greater than a jitter error, storing the new PRI measured value into a next index of the PRI table; (h) establishing that track has been acquired with a pattern level corresponding to the PRIs contained in the PRI table if the value of true checks equals a value of corresponding to the variable pattern; (i) performing step (b) if the value for Pattern is great than a value for max pattern; and (j) performing step (e) if the value for pattern is less than or equal to the value for max pattern.

BRIEF DESCRIPTION OF THE DRAWINGS

The foregoing features of this invention, as well as the invention itself, may be more fully understood from the following description of the drawings in which:

FIG. 3A is a graphical representation of a pulse train comprising a series of pulses;

DETAILED DESCRIPTION

Figure 1:
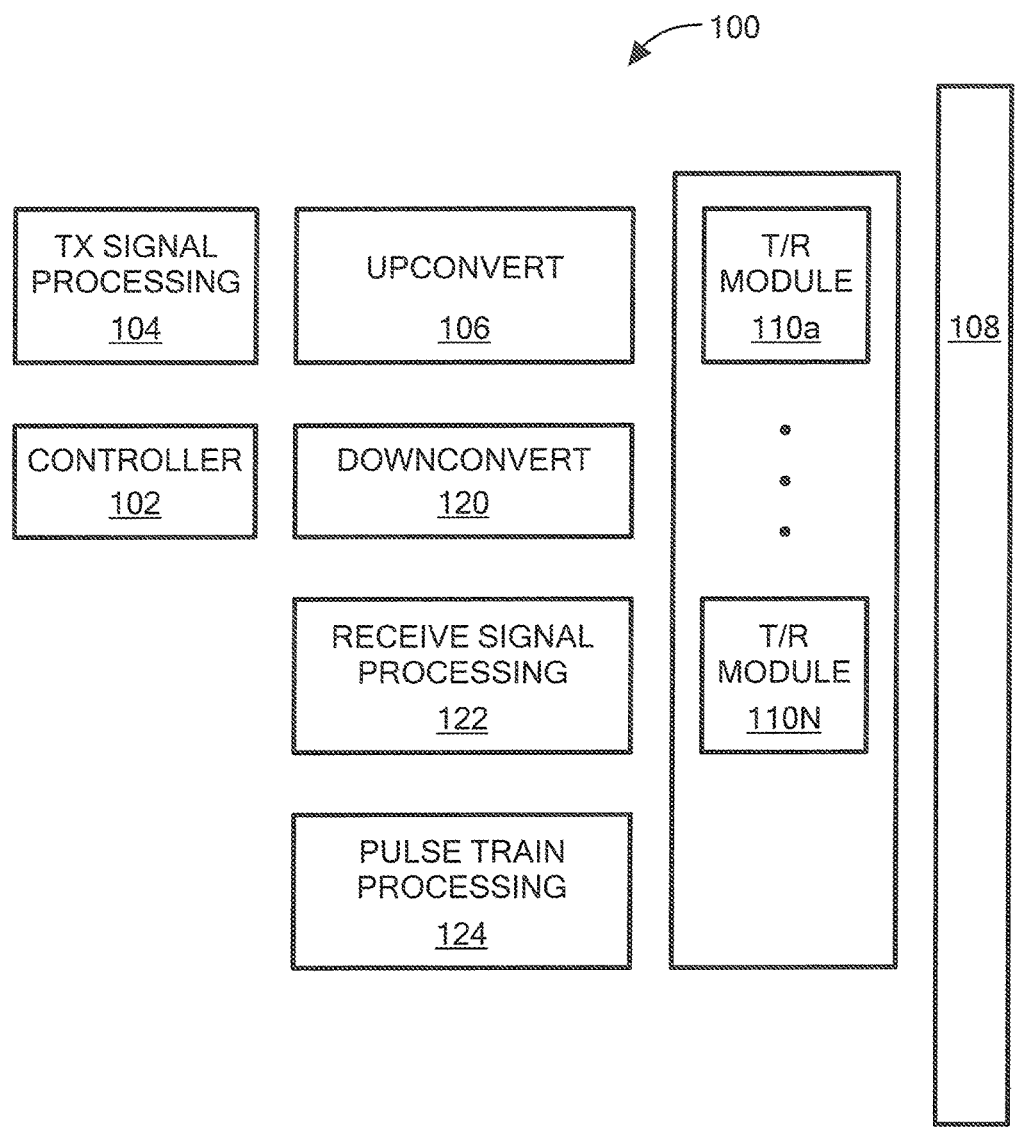
FIG. 1 is a high level representation of a radar system having transmit and receive functionality.

FIG. 1 shows an illustrative system 100 having pulse train tracking in accordance with illustrative embodiments of the invention. In general, the system 100 identifies and tracks a pulse emitter. A controller 102 controls overall operation of the system. A transmit signal processor module 104 processes information for an upconverter module 106 coupled to a series of transmit/receive (TR) modules 110a-N, which are coupled to an antenna 108 for transmitting the information into free space. In illustrative embodiments, the antenna is provided as an active electronically scanned array (AESA) antenna and the TR modules 110 include both amplitude and phase adjustment circuits (e.g. amplifiers and or phase shifting elements) as is generally known. Amplitude and phase setting in either or both of beamformer 108 and TR modules 110 are selected to provide an AESA antenna having a desired radiation pattern and beam pointing direction for one or more beams.

Signals received by the antenna 108 are provided to a downconverter module 120 coupled to a receive signal processor 122. The receive signal processor 152 may process the downconverted receive signals to extract the position, velocity, direction of motion, and/or type of target. A pulse train processing module 124 processes the received information to track pulse trains, as described more fully below.

Figure 2:
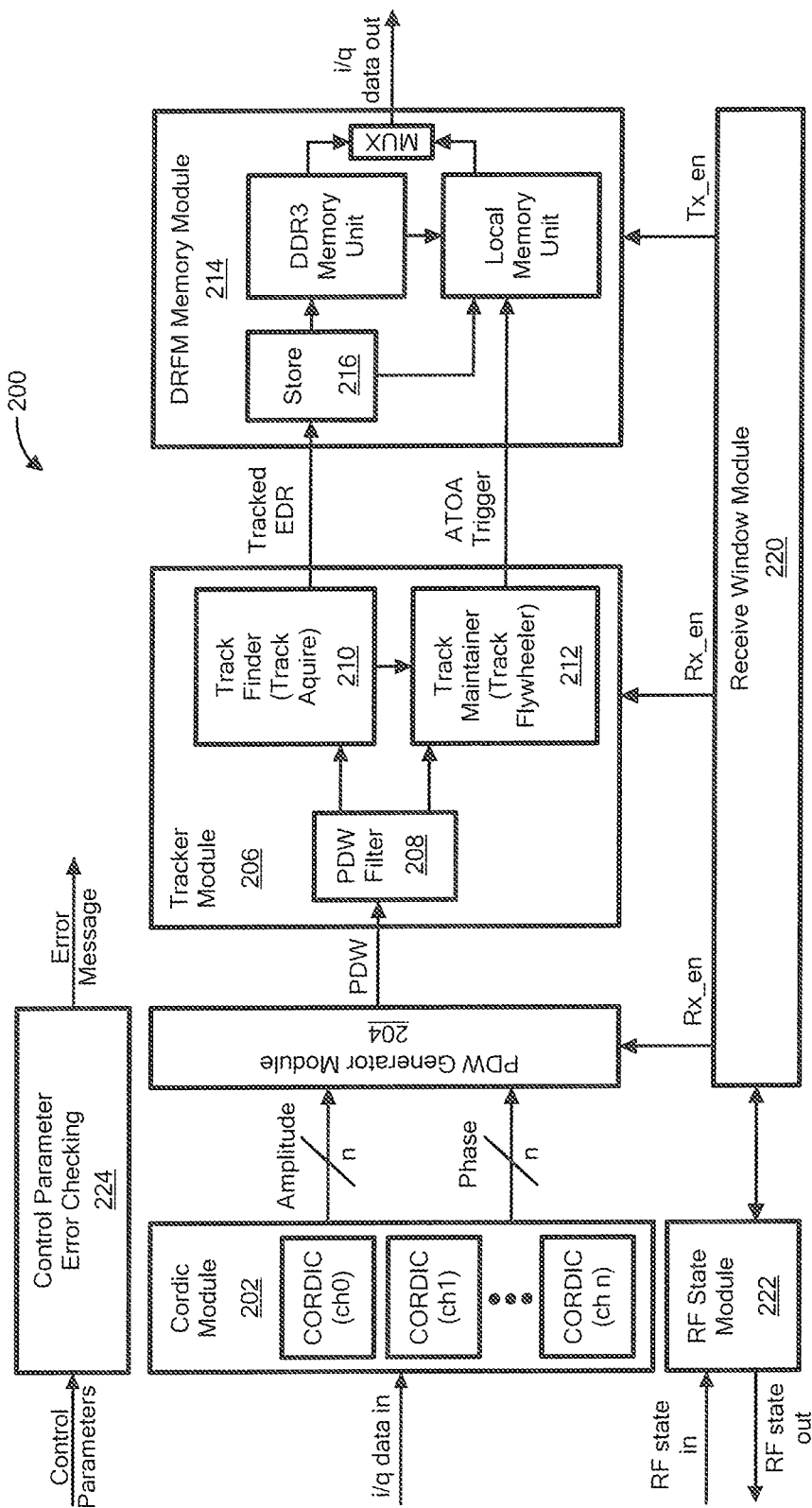
FIG. 2 is a schematic representation of a receive system to receive and process pulses from a source.

FIG. 2 shows an illustrative pulse processing system 200. A cordic module 202 receives Inphase and Quadrature (I,Q) data and outputs amplitude and phase information in a conventional manner. A pulse descriptor word (PDW) module 204 receives the amplitude and phase information and generates PDWs for processing by a tracker module 206. The tracker module 206 includes a filter module 208 providing an output to a track finder module 210 and a track maintainer module 212.

A memory module 214 includes a store module 216 for tracked PDW information and a first memory unit 218 for trigger information. The memory module 214 can output stored PDW information and I,Q output data.

A receive window module 220, which is coupled to a RF state module 222, provides respective receive enable (Rx_en) and transmit enable (Tx_en) signals to the PDW generate module 204, tracker module 206, and memory module 214. The enable signals indicate when transmit and receive operations are active to determine when receive windows occur. A control parameter module 224 receives control parameters for receive operation and generates error messages to indicate error conditions.

With regard to filtering, the PDW filter 208 accepts PDWs and control parameters containing valid ranges for pulse characteristics including center frequency, pulse width, PRI, amplitude, and intra-pulse modulation. When a new PDW arrives at the filter 208, the PDW contents are evaluated against filtering conditions, and the PDW is then passed to the track finder 210 and track maintainer 212 if the PDW is found to be valid.

In embodiments, the center frequency filter component determines whether the measured frequency in the PDW is above a lower threshold value for frequency and also below an upper threshold value for frequency. Filtering for pulse width, PRI and amplitude parameters may be processed in similar manner. In other embodiments, there may be multiple distinct allowable ranges for center frequency, pulse width, PRI and amplitude such that as long as the frequency is within one of the four provided ranges, the frequency component of the PDW will be deemed to be valid.

Embodiments of intra-pulse modulation filtering may check if modulation is present and/or check if a particular modulation, such as linear swept waveform or binary phase shift keying, is present.

In all embodiments, if all of the filtering components for center frequency, pulse width, PRI, amplitude, and intra-pulse modulation, or desired subset thereof, have been checked and have been evaluated to be valid, the PDW will be passed on to the track finder 210 and track maintainer 212.

It is understood that various receive architectures for pulse processing in accordance with illustrative embodiments of the invention will be apparent to one of ordinary skill in the art.

Figure 3:
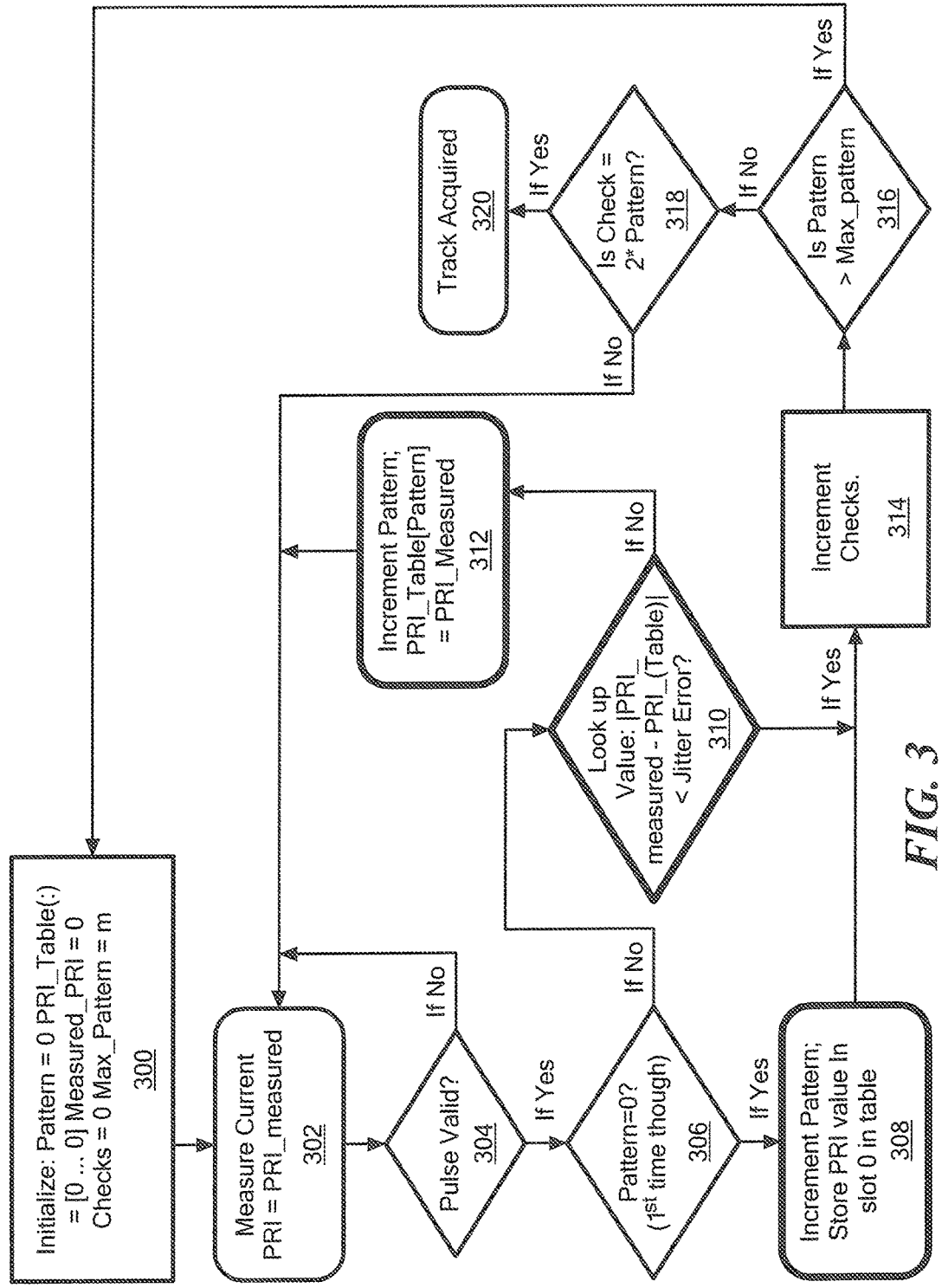
FIG. 3 is a flow diagram for tracking pulse trains.

FIG. 3 shows an illustrative set of steps for processing received pulses to acquire track on a source of the pulses. In one embodiment, this processing is performed by the tracker module 206 of FIG. 2. In step 300, initialization of processing and parameters is performed. In step 302, a pulse train is received and measured. In illustrative embodiments, measured pulse characteristics include pulse width, amplitude, and frequency. In step 304, it is determined whether the received pulse train is valid. In embodiments, determining whether pulse train is valid includes determining whether the pulse train meets various criteria for pulse width, amplitude, and/or frequency. In embodiments, the pulse validity determination can be considered a filter that filters out signals that cannot form a part of a known pulse pattern.

FIG. 3A shows a pulse train PT comprising a series of pulses P. It is understood that the mike train PT is commonly referred to as a pulse. In ranging applications, for example, a carrier signal pulse is modulated, e.g., the transmitter is turned on and off such that the pulse width corresponds to the pulse train PT in the figure. A longer pulse width paints a target with more energy to enhance detection. However, there are various tradeoffs between higher pulse widths and other performance characteristic as will be readily appreciated by one of ordinary skill in the art.

Referring again to step 304, two pulses PT separated by a time greater than some threshold can result in a determination that the PRI is not valid. If the pulse is found to be not valid, processing continues in step 302 where the next pulse is measured. If the pulse is found to be valid, processing continues in step 306 which determines whether the pattern count is zero.

If so, in step 308, the current PRI pulse information is stored and the pattern count is incremented. If not, in step 310, it is determined whether a difference between the current measured PRI and a stored PRI value is less than a threshold corresponding to a jitter error. If not, then in step 312 the pattern count is incremented and the stored pattern value is set to the current measured PRI value and processing continues in step 302 for the next pulse. If the jitter error was not exceeded, in step 314 a check count is incremented. In step 316, the pattern value is compared to a value corresponding to a maximum pattern value. If greater, the value of the check count is compared to value two times the pattern value, for example, in step 318. If equal, step 320 acquires a track. If not greater, then processing continues in step 302.

For example, a first pulse train having certain characteristics can be referred to as A. A second pulse train is then received and compared to A. If the pulse trains have similar pulse width, amplitude and frequency, and the PRI difference is less than the jitter error, then it appears that consecutive 'A' pulse trains have been received, e.g., A-A. In embodiments, pulse train modulation can be examined as well.

It is understood that pulse trains can be received have many different patterns. For example, pulse pattern A-A-A-A can be received at the same PRI, which is readily detectable. One pulse pattern can be A-B-A-B for which either A or B can be received first. Once the pattern is identified, a track of the emitter source can be identified.

After pattern counter is incremented in step 308, it is determined in step 314 whether the pattern count value is greater than a maximum value to ensure that the system does not enter a loop in which a pattern is never found. In step 318, it is determined if the pattern count is greater than a selected value. In one embodiment, it is determined if two times the pattern count is equal to some even value, e.g., four. Thus, if an A-B pulse pattern is received, two times the pattern count of four equals four. If the pattern count is found equal, then in step 320, track is acquired on the emitter that emitted the identified pulse pattern.

The above can be provided in pseudocode as set forth below:

1. Measure the first PRI value, PRI_Measured, initialize a variable Pattern = 0, initialize True_Checks=0;
2. Store this value in this first slot of the PRI_Table
3. Increment Pattern = Pattern+1 and Checks=Checks+1
4. Measure the next PRI value, this becomes the new PRI_Measured
5. If |PRI_Table − PRI_Measured| <= Jitter_Error, increment Checks=Checks+1
6. If |PRI_Table − PRI_Measured| > Jitter_Error, store the new PRI_Measured value into the next index of the PRI_Table. Increment Pattern = Pattern + 1
7. If True_Checks = Pattern*2, consider a track has been acquired with a Pattern level of Pattern with the PRI's contained in PRI_Table
8. If Pattern > Max_Pattern, go back to step 1.
9. If Pattern <= Max_Pattern, go to step 4.

An illustrative table below shows how the above values change for a pattern of ABCABCABC:

| After A: | |
|---|---|
| A | 1 |

Pattern = 1
Checks = 1

| After AB: | |
|---|---|
| A | 1 |
| B | 1 |

Pattern = 2
Checks = 1

| After ABC: | |
|---|---|
| A | 1 |
| B | 1 |
| C | 1 |

Pattern = 3
Checks = 1

| After ABCA: | |
|---|---|
| A | 2 |
| B | 1 |
| C | 1 |

Pattern = 3
Checks = 1

| After ABCAB | |
|---|---|
| A | 2 |
| B | 2 |
| C | 1 |

Pattern = 3
Checks = 2
After ABCABCABC

| | |
|---|---|
| A | 3 |
| B | 3 |
| C | 3 |

Pattern = 3
Checks = 6
Since Checks = Pattern * 2, a track is acquired

In general, a wide range of PRI stagger patterns of arbitrary lengths are possible such as ABCABC. Other patterns, known as dwell and switch can be tracked which have several identical pulses before switching. For example, AABBAABB pulses can also appear random or any other arbitrary pattern before the pattern repeats. A pattern that repeats every eight pulses for example is ABCCDBDEAB-CCDBDE.

It is understood that the processing described above is illustrative. Values can be stored in tables or any suitable such data structure or device. In addition, count values, such as the count of the pattern, can be provided as any suitable value to meet the needs of a particular application. Various modifications, additions, and the like to alter the illustrative processing described above will be well within the scope of the claimed invention.

Figure 4:
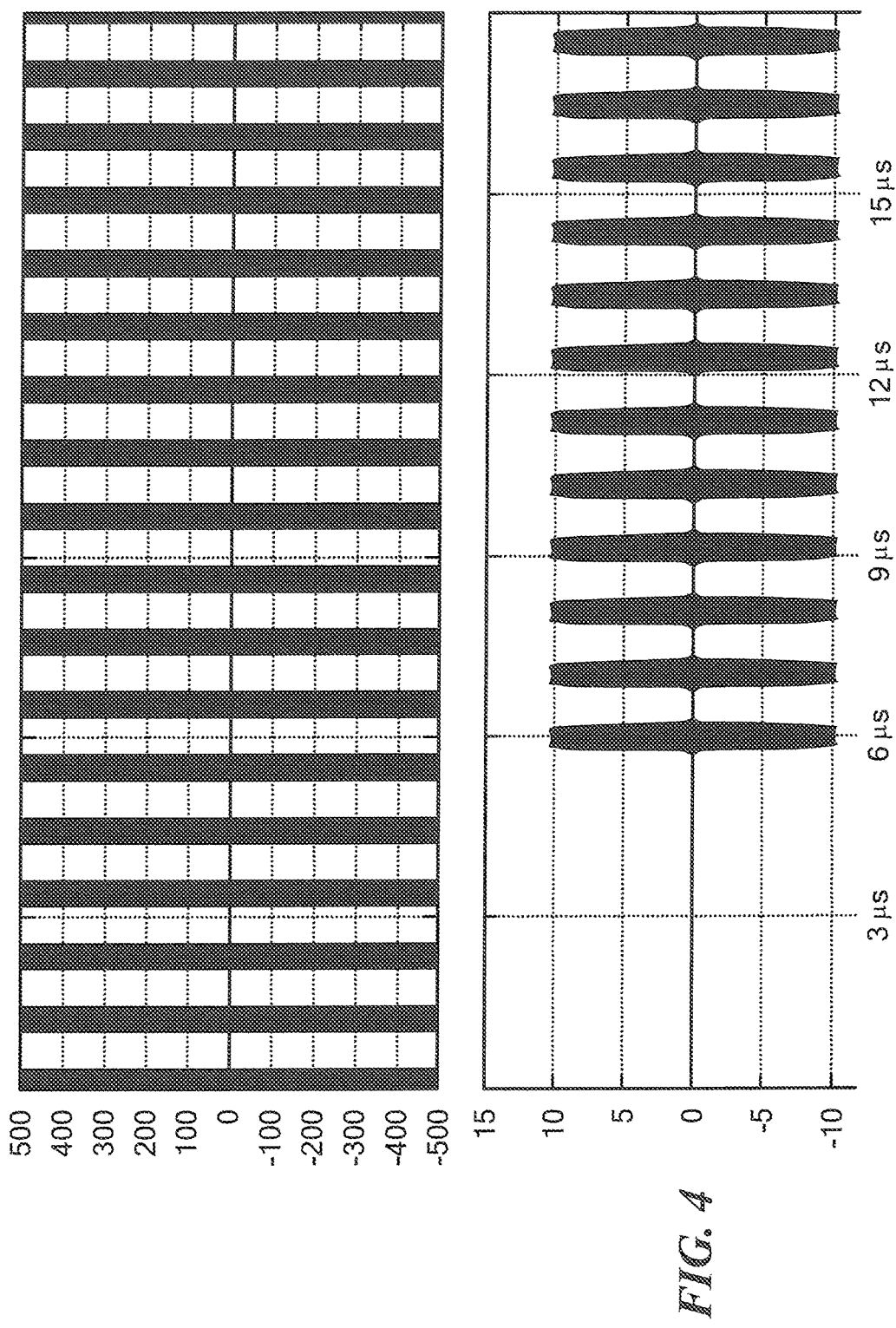
FIG. 4 is a flow diagram for maintaining track of pulse trains.

FIG. 4 shows a graphical representation of a series of pulse trains having a given PRI that are received, processed, and identified in less than about 700 ns. The 700 ns is the time from one pulse starts to the next pulse. The illustrated pulse trains depict a standard constant PRI pattern. The top plot is the input to the tracker, the bottom plot is the output of the tracker where the tracker has predicted the pulse train and replicated it with a small delay.

Figure 5:
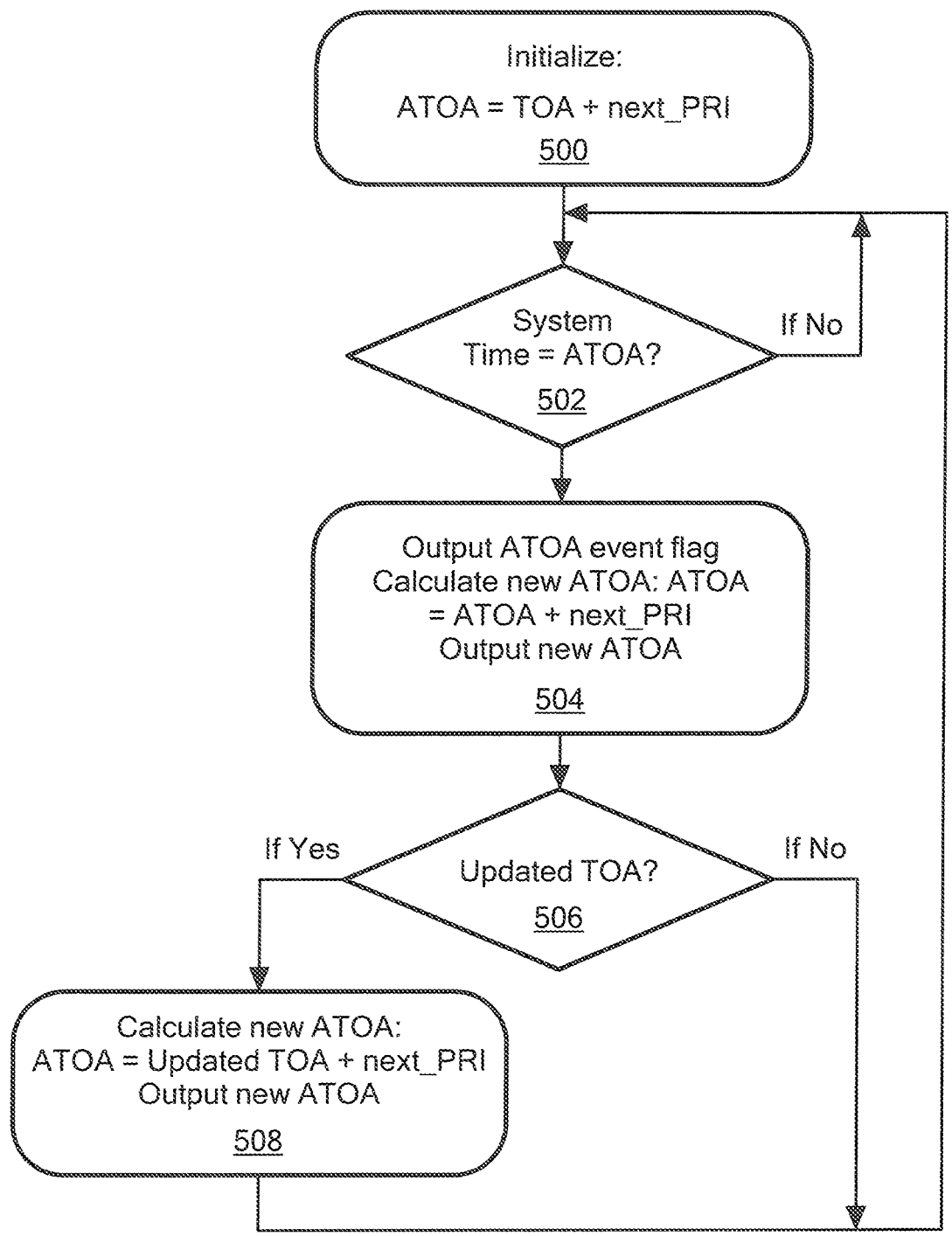
FIG. 5 is a flow diagram for managing tracking of pulse trains.

FIG. 5 shows an illustrative sequence of steps for maintaining tracks. A track is maintained by predicting the anticipated time of arrival (ATOA) of the nest pulse and checking that the corresponding time of arrival (TOA) of the pulse matches the most recent ATOA prediction. In step 500, initialization occurs for an anticipated time of arrival (ATOA) value, which is the sum of a time of arrival (TOA) of a pulse and a next PRI value. In step 502, it is determined whether the system time is equal to the ATOA value. If not, processing continues in step 500. If so, in step 504, an AOTA flag is set and output and a new, updated, ATOA is calculated and output. In step 506, it is determined whether AOTA prediction needs to be updated. An update is required when the TOA does not equal the last ATOA prediction. If not, processing continues in step 502. If so, in step 508, a new ATOA is computed. In an embodiment, the new ATOA is generated as a sum of the measured TOA and a next PRI. The updated ATOA is then output and processing continues in step 502.

Figure 6:
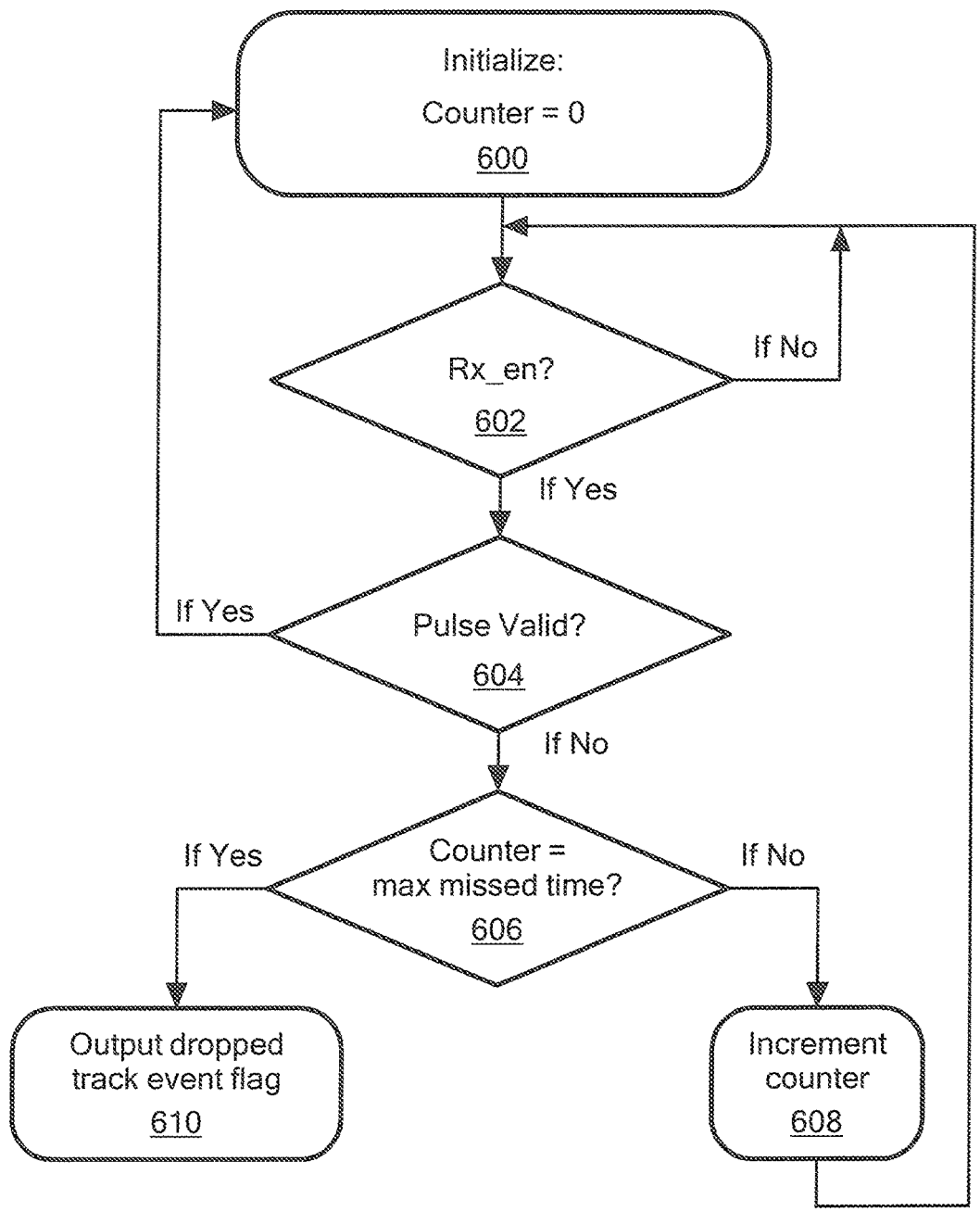
FIG. 6 is a flow diagram for managing dropping tracks of pulse trains.

FIG. 6 shows an illustrative sequence of steps for managing dropping of tracks. If the pattern that was used to originally identify and acquire the track is no longer present, after a given number of missing pulses—where a missing pulse is defined as a pulse was expected at a given time according to the pattern but which does not appear—the track is dropped and processing starts over at track acquire. In step 600, initialization occurs. In step 602, it is determined whether receive enable (Rx_en) is active (see FIG. 2). In so, it is determined in step 604 whether the present pulse is valid. If so, processing continues in step 600 to reset the counter. If not, in step 606 it is determined whether the number of invalid pulses exceeds a threshold value. In embodiments, a counter is compared against a maximum amount of missed times. If the counter does not equal the threshold, in step 608 the counter is incremented and processing continues in step 602. If the maximum count is reached, in step 610 a dropped track indicator, such as a dropped track flag, is output. The flag can be processed and the track is dropped.

One of ordinary skill in the art will appreciate the improvement of the illustrative embodiments over conventional systems in which tens, hundreds, or even thousands of pulses are extracted from memory and processed to determine if some pattern exists in the received pulses. For example, after interleaving the received pulses, correlation processing can be performed to identify pulse patterns in a resource intensive way involving possible millions of memory operations.

Figure 7:
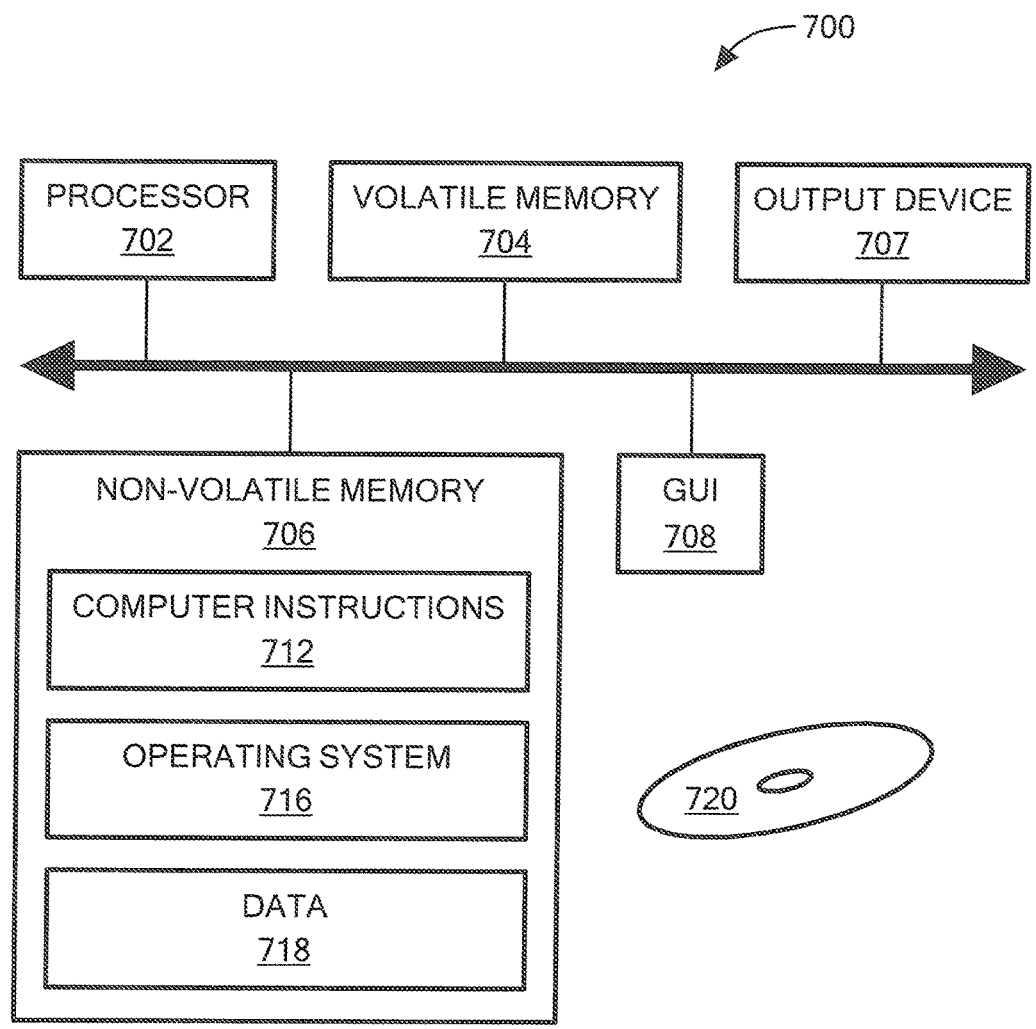
FIG. 7 is a schematic representation of an illustrative computer that can perform at least a portion of the processing described herein.

FIG. 7 shows an exemplary computer 700 that can perform at least part of the processing described herein. The computer 700 includes a processor 702, a volatile memory 704, a non-volatile memory 706 (e.g., hard disk), an output device 707 and a graphical user interface (GUI) 708 (e.g., a mouse, a keyboard, a display, for example). The non-volatile memory 706 stores computer instructions 712, an operating system 716 and data 718. In one example, the computer instructions 712 are executed by the processor 702 out of volatile memory 704. In one embodiment, an article 720 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
   (a) receiving a first pulse train from an emitter;
   (b) measuring pulse repetition interval parameters of the first pulse train;
   (c) receiving a further pulse train;
   (d) measuring pulse repetition interval parameters of the further pulse train;
   (e) incrementing, using a computer processor, a check pattern count based upon whether the further pulse train has a jitter error less than a jitter threshold, wherein the jitter error corresponds to a difference between the pulse repetition interval characteristics of the further pulse train and pulse repetition interval parameters of a prior pulse train;
   (f) comparing the check pattern count to a track threshold;
   (g) determining whether a track for the emitter has been acquired based upon the check pattern comparison; and
   (h) repeating steps (c) to (f).

2. The method according to claim 1, wherein the parameters include pulse width, amplitude, and frequency.

3. The method according to claim 1, further including performing repetition interval parameter filtering on pulse descriptor words (PDWs) generated from the first and/or further pulse train.

4. The method according to claim 3, further including performing repetition interval parameter filtering on center frequency, pulse width, PRI, amplitude, and/or intra-pulse modulation.

5. The method according to claim 4, further including determining whether the center frequency of a first one of the PDWs is above a low threshold value and below a high threshold value.

6. The method according to claim 1, further including determining an anticipated time of arrival for the further pulse train.

7. The method according to claim 6, further including determining the anticipated time of arrival for the further pulse train from a current anticipated time of arrival and a next pulse repetition interval.

8. The method according to claim 1, further including dropping the emitter track if the detected pattern is no longer detected for a selected amount of time.

9. The method according to claim 1, further including acquiring the emitter track without writes to memory.

10. A system, comprising:
a tracker module having a processor and a memory configured to:
(a) receive a first pulse train from an emitter;
(b) measure pulse repetition interval parameters of the first pulse train;
(c) receive a further pulse train;
(d) measure pulse repetition interval parameters of the further pulse train;
(e) increment a check pattern count based upon whether the further pulse train has a jitter error less than a jitter threshold, wherein the jitter error corresponds to a difference between the pulse repetition interval parameters of the further pulse train and pulse repetition interval parameters of a prior pulse train;
(f) compare the check pattern count to a track threshold;
(g) determine whether a track for the emitter has been acquired based upon the check pattern comparison; and
(h) repeat (c) to (g).

11. The system according to claim 10, wherein the parameters include pulse width, amplitude, and frequency.

12. The system according to claim 10, wherein the tracker module is further configured to perform repetition interval parameter filtering on pulse descriptor words (PDWs) generated from the first and/or further pulse train.

13. The system according to claim 12, wherein the tracker module is further configured to perform repetition interval parameter filtering on center frequency, pulse width, PRI, amplitude, and/or intra-pulse modulation.

14. The system according to claim 13, wherein the tracker module is further configured to determine whether the center frequency of a first one of the PDWs is above a low threshold value and below a high threshold value.

15. The system according to claim 10, wherein the tracker module is further configured to determine an anticipated time of arrival for the further pulse train.

16. The system according to claim 15, wherein the tracker module is further configured to determine the anticipated time of arrival for the further pulse train from a current anticipated time of arrival and a next pulse repetition interval.

17. The system according to claim 10, wherein the tracker module is further configured to drop the emitter track if the detected pattern is no longer detected for a selected amount of time.

18. A method, comprising:
(a) receiving a first PRI value for a pulse train received by an antenna;
(b) measuring the first PRI value as variable PRI measured, initializing a variable pattern, and initializing a variable true check;
(c) storing the first PRI value in a first slot of a PRI table;
(d) incrementing the variable pattern and incrementing the variable checks;
(e) measuring a next PRI value that becomes a new value for the variable PRI measured;
(f) incrementing the value of variable checks if the value stored in the PRI table minus the value for PRI measured is less than or equal to a jitter error;
(g) incrementing the variable pattern if the value of PRI table minus PRI measured is greater than a jitter error, storing the new PRI measured value into a next index of the PRI table;
(h) establishing that track has been acquired with a pattern level corresponding to the PRIs contained in the PRI table if the value of true checks equals a value of corresponding to the variable pattern;
(i) performing step (b) if the value for pattern is great than a value for max pattern;
(j) performing step (e) if the value for pattern is less than or equal to the value for max pattern.

19. The method according to claim 1, further comprising incrementing, using a computer processor, a pattern count when the jitter error of the further pulse train is equal to or greater than the jitter threshold.

20. The method according to claim 19, wherein the track threshold is determined using the pattern count.

* * * * *